United States Patent
Alvi et al.

(10) Patent No.: US 11,876,034 B2
(45) Date of Patent: Jan. 16, 2024

(54) 3-D POWER MODULES WITH DOUBLE SIDED COOLING PER SEMICONDUCTOR DIE

(71) Applicant: GM GLOBAL TECHNOLOGY OPERATIONS LLC, Detroit, MI (US)

(72) Inventors: Muhammad H. Alvi, Troy, MI (US); Ming Liu, Troy, MI (US); Rashmi Prasad, Troy, MI (US); Anthony M. Coppola, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 338 days.

(21) Appl. No.: 17/215,883

(22) Filed: Mar. 29, 2021

(65) Prior Publication Data
US 2022/0310481 A1     Sep. 29, 2022

(51) Int. Cl.
*H01L 23/473* (2006.01)
*H01L 25/065* (2023.01)
*H05K 7/20* (2006.01)

(52) U.S. Cl.
CPC ........ *H01L 23/473* (2013.01); *H01L 25/0657* (2013.01); *H05K 7/209* (2013.01); *H05K 7/20936* (2013.01); *H01L 2225/06524* (2013.01); *H01L 2225/06589* (2013.01)

(58) Field of Classification Search
CPC .............. H01L 23/473; H01L 25/0657; H01L 23/3735; H01L 23/367; H01L 2225/06589
See application file for complete search history.

(56) References Cited

U.S. PATENT DOCUMENTS

| | | | |
|---|---|---|---|
| 2008/0128116 A1* | 6/2008 | Dangelo | F28D 15/046 165/104.21 |
| 2020/0152547 A1* | 5/2020 | Alawieh | H01L 25/18 |
| 2020/0273778 A1* | 8/2020 | Hoegerl | H01L 21/4882 |
| 2020/0375061 A1* | 11/2020 | Alawieh | H05K 7/20936 |

* cited by examiner

*Primary Examiner* — Kyoung Lee

(57) ABSTRACT

A power module is provided and includes first stack, second stack, and third stacks of layers, a heat pipe, and at least one cold plate or heat sink. The third stack of layers is disposed between the first and second stacks of layers and includes a first semiconductor die, a second semiconductor die and a center spacer layer disposed between the first semiconductor die and the second semiconductor die. The heat pipe extends at least partially into the center spacer layer. The at least one cold plate or heat sink receives thermal energy from the first stack of layers and the second stack of layers. The first stack of layers, the second stack of layers, the third stack of layers, the heat pipe and the at least one cold plate or heat sink facilitate dual sided cooling of each of the first semiconductor die and the second semiconductor die.

20 Claims, 12 Drawing Sheets

3-D POWER MODULES WITH DOUBLE SIDED COOLING PER SEMICONDUCTOR DIE

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to cooling of power modules including semiconductor dies.

A power module can include circuit components of various types of power converters or inverters, such as a boost converter, a buck converter, a voltage source inverter, or a current source inverter. As an example, power modules can be used to supply power to motors of a vehicle for propulsion purposes, source high voltages (e.g., 100-1600V) and operate at high power levels (e.g., 100 kilowatt (kW)-1 megawatt (MW)). The power modules may include components of voltage source inverters for converting direct current (DC) voltage to alternating current (AC) voltage to drive the motors. Each converter and/or inverter can include switch pairs (e.g., metal-oxide-semiconductor field-effect transistor (MOSFET) pairs or insulated-gate bipolar transistor (IGBT) pairs). As an example, an inverter can include three switch pairs, where each switch pair includes a high side switch and a low side switch that together provide a half-bridge structure. The three switch pairs provide a full bridge structure.

SUMMARY

A power module is provided and includes a first stack of layers, a second stack of layers, a third stack of layers, a first heat pipe, and at least one cold plate or heat sink. The third stack of layers is disposed between the first stack of layers and the second stack of layers and includes a first semiconductor die, a second semiconductor die and a first center spacer layer disposed between the first semiconductor die and the second semiconductor die. The first heat pipe extends at least partially into the first center spacer layer. The at least one cold plate or heat sink receives thermal energy from the first stack of layers and the second stack of layers. The second stack of layers, the third stack of layers, the first heat pipe and the at least one cold plate or heat sink facilitate dual sided cooling of each of the first semiconductor die and the second semiconductor die.

In other features, the first stack of layers includes a first conductive layer, a second conductive layer, and a first dielectric layer disposed between the first conductive layer and the second conductive layer. The second stack of layers includes a third conductive layer, a fourth conductive layer, and a second dielectric layer disposed between the first conductive layer and the second conductive layer.

In other features, the power module further includes a cooling circuit configured to circulate a coolant to and from the at least one cold plate or heat sink.

In other features, the first heat pipe includes: a wick structure disposed between the first semiconductor die and the second semiconductor die; and a vapor chamber disposed at least partially between the first semiconductor die and the second semiconductor die.

In other features, the first heat pipe includes: a wick structure disposed between the first semiconductor die and the second semiconductor die; and a vapor chamber that is not disposed between the first semiconductor die and the second semiconductor die.

In other features, the power module further includes: a first attachment layer disposed between the first semiconductor die and the second stack of layers; and a second attachment layer disposed between the second semiconductor die and the third stack of layers.

In other features, the power module further includes: a third attachment layer disposed between the first semiconductor die and the first center spacer layer; and a fourth attachment layer disposed between the second semiconductor die and the first center spacer layer.

In other features, the first center spacer layer is a conductive layer that serially connects a first switch of the first semiconductor die to a second switch of the second semiconductor die. The first switch and the second switch are arranged to provide a half-bridge structure.

In other features, the power module further includes a fourth stack of layers, a fifth stack of layers, a sixth stack of layers, and a second heat pipe. The sixth stack of layers is disposed between the fourth stack of layers and the fifth stack of layers and includes a third semiconductor die, a fourth semiconductor die and a second center spacer layer disposed between the third semiconductor die and the fourth semiconductor die. The second heat pipe extends at least partially into the second center spacer layer. The at least one cold plate or heat sink receives thermal energy from the fourth stack of layers and the fifth stack of layers. The fourth stack of layers, the fifth stack of layers, the second heat pipe and the at least one cold plate or heat sink facilitate dual sided cooling of each of the third semiconductor die and the fourth semiconductor die.

In other features, the first semiconductor die, the second semiconductor die, the third semiconductor die and the fourth semiconductor die collectively provide a full bridge converter.

In other features, a power module is provided and includes a first stack of layers, a first heat pipe, a second stack of layers, and a third stack of layers. The first stack of layers includes a first semiconductor die, a second semiconductor die and a first center spacer layer disposed between the first semiconductor die and the second semiconductor die. The first heat pipe extends at least partially into the first center spacer layer and receiving thermal energy from the first semiconductor die and the second semiconductor die. The second stack of layers transfers thermal energy away from the first semiconductor die and includes a first conductive layer, a second conductive layer, and a first dielectric layer disposed between the first conductive layer and the second conductive layer. The third stack of layers transfers thermal energy away from the second semiconductor die and includes a third conductive layer, a fourth conductive layer, and a second dielectric layer disposed between the third conductive layer and the fourth conductive layer. The first stack of layers is disposed between the second stack of layers and the third stack of layers. The second stack of layers, the third stack of layers and the first heat pipe facilitate dual sided cooling of each of the first semiconductor die and the second semiconductor die.

In other features, the power module further includes at least one cold plate or heat sink configured to receive thermal energy from the second stack of layers and the third stack of layers to cool the first semiconductor die and the second semiconductor die.

In other features, the power module further includes a cooling circuit configured to circulate a coolant to and from the at least one cold plate or heat sink.

In other features, the first heat pipe includes: a wick structure disposed between the first semiconductor die and the second semiconductor die; and a vapor chamber disposed at least partially between the first semiconductor die and the second semiconductor die.

In other features, the first heat pipe includes: a wick structure disposed between the first semiconductor die and the second semiconductor die; and a vapor chamber that is not disposed between the first semiconductor die and the second semiconductor die.

In other features, the power module further includes: a first attachment layer disposed between the first semiconductor die and the second stack of layers; and a second attachment layer disposed between the second semiconductor die and the third stack of layers.

In other features, the power module further includes: a third attachment layer disposed between the first semiconductor die and the first center spacer layer; and a fourth attachment layer disposed between the second semiconductor die and the first center spacer layer.

In other features, the first center spacer layer is a conductive layer that serially connects a first switch of the first semiconductor die to a second switch of the second semiconductor die. The first switch and the second switch are arranged to provide a half-bridge structure.

In other features, the power module further includes a fourth stack of layers, a second heat pipe, a fifth stack of layers and a sixth stack of layers. The fourth stack of layers includes a third semiconductor die, a fourth semiconductor die and a second center spacer layer disposed between the third semiconductor die and the fourth semiconductor die. The second heat pipe extends at least partially into the second center spacer layer and receiving thermal energy from the third semiconductor die and the fourth semiconductor die. The fifth stack of layers transfers thermal energy away from the third semiconductor die. The sixth stack of layers transfers thermal energy away from the fourth semiconductor die. The fourth stack of layers is disposed between the fifth stack of layers and the sixth stack of layers. The at least one cold plate or heat sink receives thermal energy from the second stack of layers, the third stack of layers, the fifth stack of layers and the sixth stack of layers. The first semiconductor die, the second semiconductor die, the third semiconductor die and the fourth semiconductor die collectively provide a full bridge converter.

In other features, the first stack of layers includes a third semiconductor die, a fourth semiconductor die and a second center spacer layer disposed between the third semiconductor die and the fourth semiconductor die. The second heat pipe extends at least partially into the second center spacer layer and receives thermal energy from the third semiconductor die and the fourth semiconductor die. The third stack of layers transfers thermal energy away from the third semiconductor die. The fourth stack of layers transfers thermal energy away from the fourth semiconductor die. At least one cold plate or heat sink receives thermal energy from the second stack of layers, the third stack of layers, the fifth stack of layers and the sixth stack of layers. The first semiconductor die, the second semiconductor die, the third semiconductor die and the fourth semiconductor die collectively provide a full bridge converter.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Traditional power modules typically include a single die layer that is disposed between conductive layers. The conductive layers are part of respective direct bond copper (DBC) stacks, which are attached to heat sinks for transferring thermal energy from the die to the heat sinks. As an alternative, a die may be attached to a first side of a single DBC stack. A heat pipe may be attached to the first side of the DBC stack adjacent the die. The second side of the DBC stack, opposite the first side, may be disposed on a base plate, which is attached to a heat sink. These and other traditional power module arrangements have large package sizes and limited cooling. Due to the arrangements of the power modules and large package sizes, the power modules and corresponding circuits tend to have large package sizes, low power densities, high parasitic inductances and parasitic resistances, and high power losses.

The examples set forth herein include three-dimensional (3-D) power modules with stacked dies having double sided cooling per die. Each stacked power module structure includes a center spacer layer disposed between stacked dies, where the center spacer layer includes at least a portion of a heat pipe. Sides of the dies opposite the center spacer layer are attached to DBC stacks or the like, which are in turn attached to at least one cold plate. The heat pipe is an integral part of the stacked structure, is disposed at least partially between the dies, and provides passive fully contained cooling. The cold plate is actively cooled by flow of a coolant in and out of the cold plate.

The disclosed 3-D stacked power module structures are compact, have low corresponding commutation loop area and inductance, low parasitic inductance, low parasitic resistance, and experience low losses. Due to the compact structures, the power density of the power modules is high. The structures have improved thermal management (or cooling) over traditional power module structures and thus have improved reliability. The 3-D stacked power modules include heat pipe structures that perform as thermal terminals, which are analogous to electrical terminals as further described below.

Figure 1:
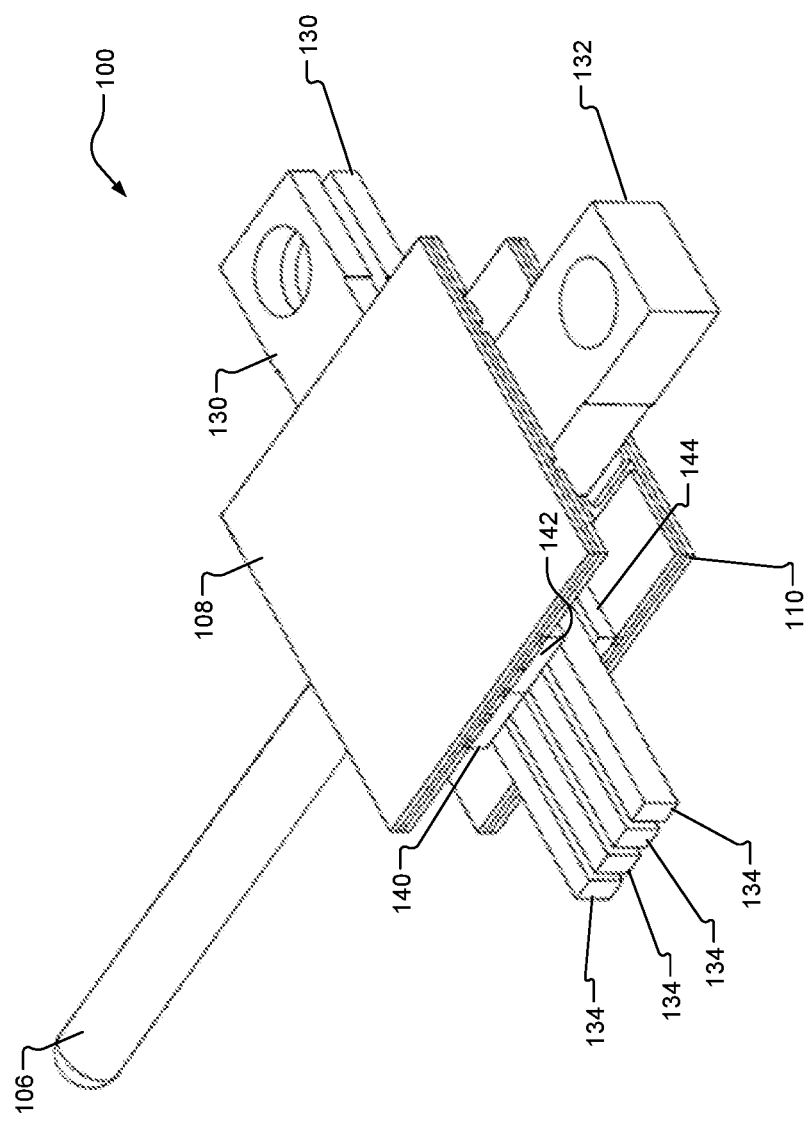
FIG. 1 is a perspective view of a half-bridge power module including stacked dies with double sided cooling per die and stacked DC terminals in accordance with the present disclosure.
Figure 2:
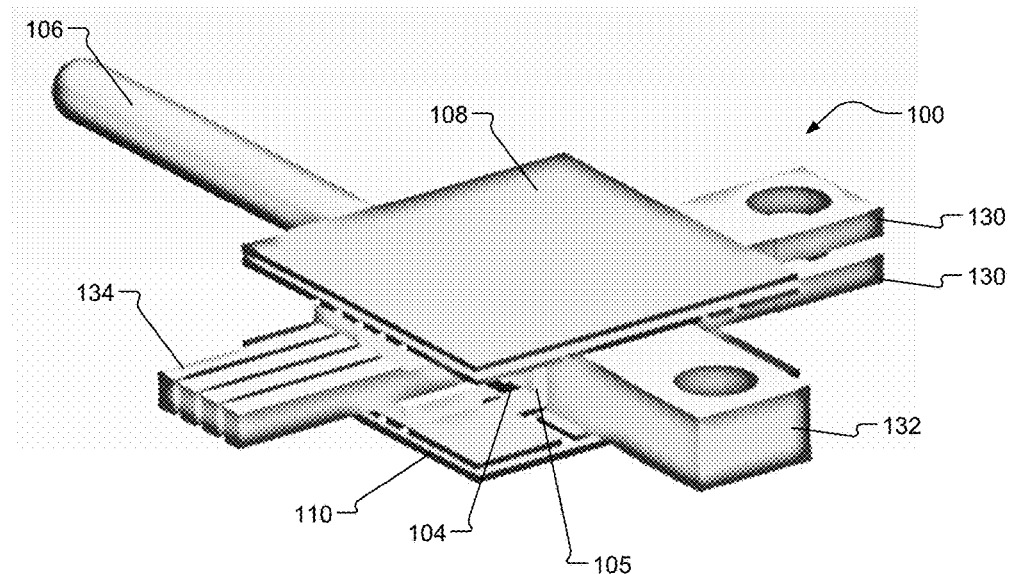
FIG. 2 is another perspective view of the half-bridge power module of FIG. 1.
Figure 3:
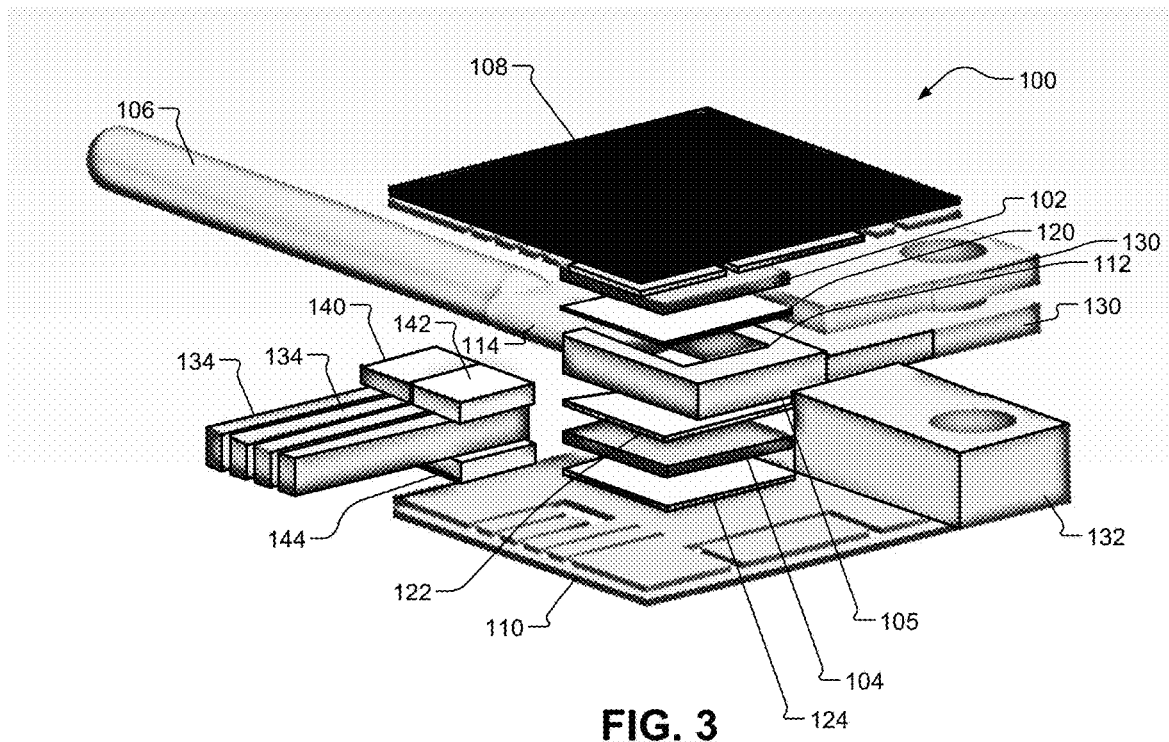
FIG. 3 is an exploded view of the half-bridge power module of FIG. 1.
Figure 6:
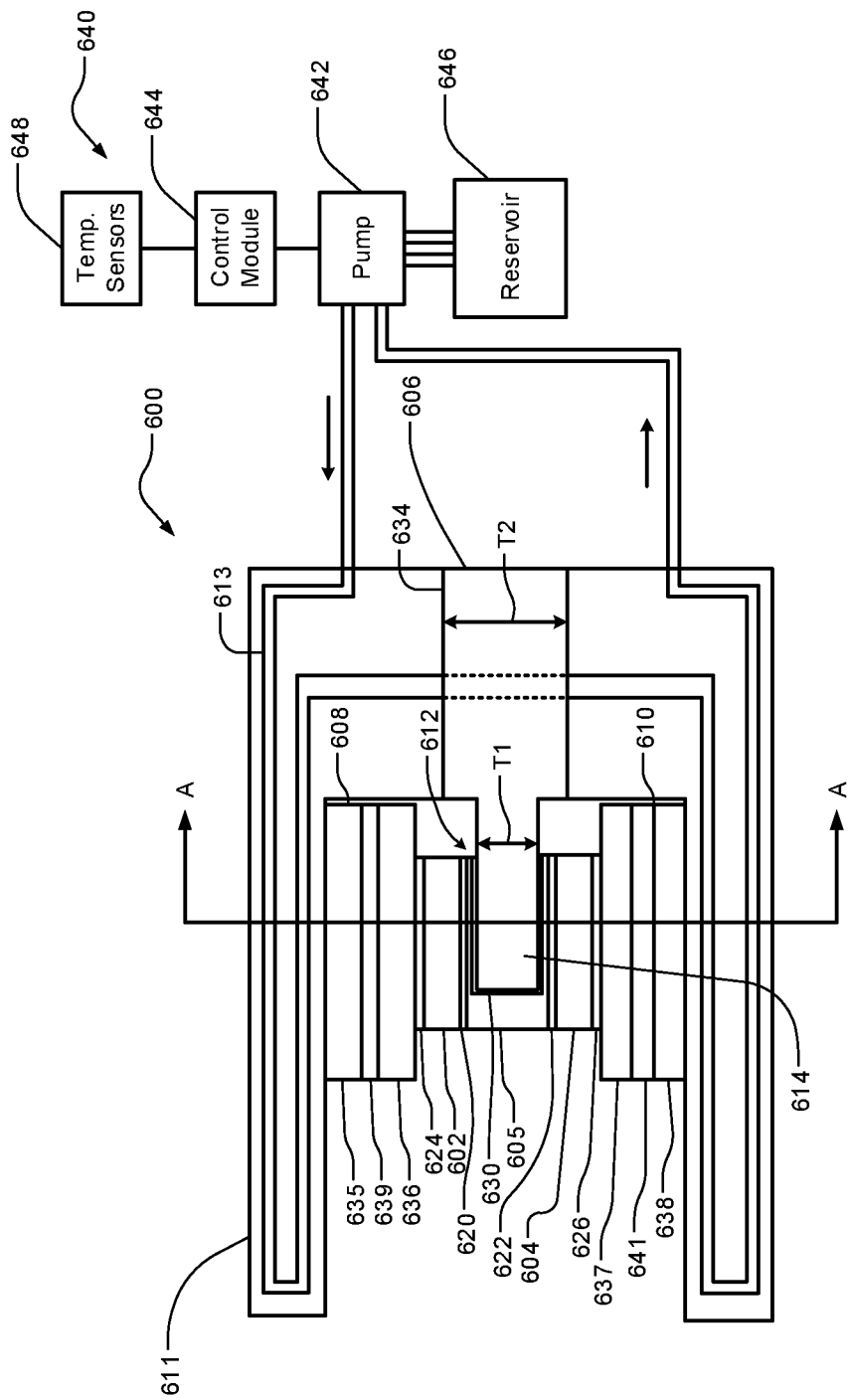
FIG. 6 is a side cross-sectional view of a half-bridge power module including stacked dies with double sided cooling per die and a corresponding cooling circuit in accordance with the present disclosure.

FIGS. 1-3 show a half-bridge power module 100 including stacked dies 102, 104, a center spacer layer 105, a heat pipe 106, and DBC stacks 108, 110. The half-bridge power module 100 may further include a cold plate, an example of which is shown in FIG. 6. Although a cold plate is shown, the cold plate may be replaced with and/or be attached to a heat sink. This applies to other cold plates of the embodiments and examples disclosed herein. The cold plates and the heat sinks may be interchangeable or used together to provide increased cooling. The center spacer layer 105 is disposed between the dies 102, 104. The heat pipe 106 extends at least partially into the center spacer layer 105 between the dies 102, 104. The dies 102, 104, the center spacer layer 105 and a portion of the heat pipe 106 are disposed between the DBC stacks 108, 110. The DBC stacks 108, 110 are disposed between portions of the cold plate. Thermal energy passes (i) from first sides of the dies 102, 104 to the center spacer layer 105 and to the heat pipe 106, and (ii) from second sides of the dies 102, 104 opposite the first sides of the dies 102, 104 to the DBC stacks 108, 110, which pass the thermal energy to the cold plate.

The dies 102, 104 may fully or partially form one or more switches. The dies 102, 104 may each further include one or more diodes. In one embodiment, each of the dies 102, 104 includes a respective switch and may also include a respective diode. The die 102 may include a high-side switch. The die 104 may include a low-side switch that is connected in series with the high-side switch to provide a half-bridge structure. Example converter structures are shown in FIGS. 10-14. The dies 102, 104 may be formed of silicon, silicon carbide, diamond, and/or gallium nitride.

The center spacer layer 105 may directly contact the dies 102, 104 or as shown may be in contact with first attachment layers 120, 122, which separate the dies 102, 104 from the center spacer layer 105. The dies 102, 104 may be separated from the DBC stacks 108, 110 by second attachment layers (attachment layer 124 is shown in FIG. 3 between the die 104 and the DBC stacks 110). The center spacer layer 105 may be 'C'-shaped or cup-shaped and include an open end 112 to receive a portion 114 of the heat pipe 106. The heat pipe 106 may be generally cylindrical shaped except in the portion 114, which may be: flattened to be compatible with power module packaging; disposed between the dies 102, 104; and provide improved thermal energy transfer from the dies 102, 104 to the heat pipe 106. In another embodiment, a large portion of or all of the heat pipe 106 is flattened.

The power module 100 may further include stacked DC terminals 130, an AC terminal 132, and other terminals 134. The other terminals 134 may include gate pins of the switches of the dies 102, 104, temperature sensing pins for detecting temperatures within the power module 100, drain (or return), etc. Attachment layers 140, 142, 144 may be disposed between ends of the terminals 134 and the DBC stacks 108, 110.

Figure 4:
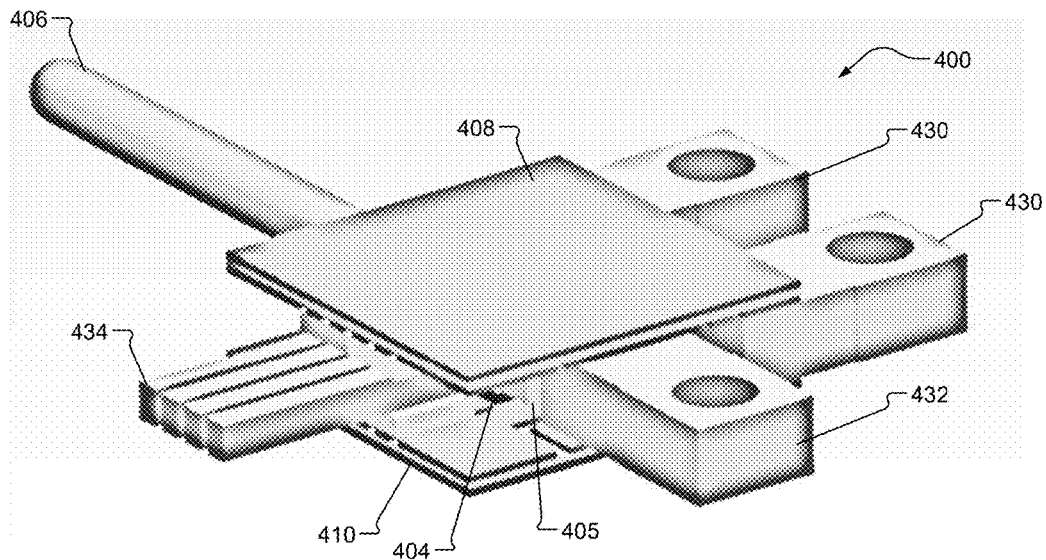
FIG. 4 is a perspective view of a half-bridge power module including stacked dies with double sided cooling per die and separated DC terminals in accordance with the present disclosure.
Figure 5:
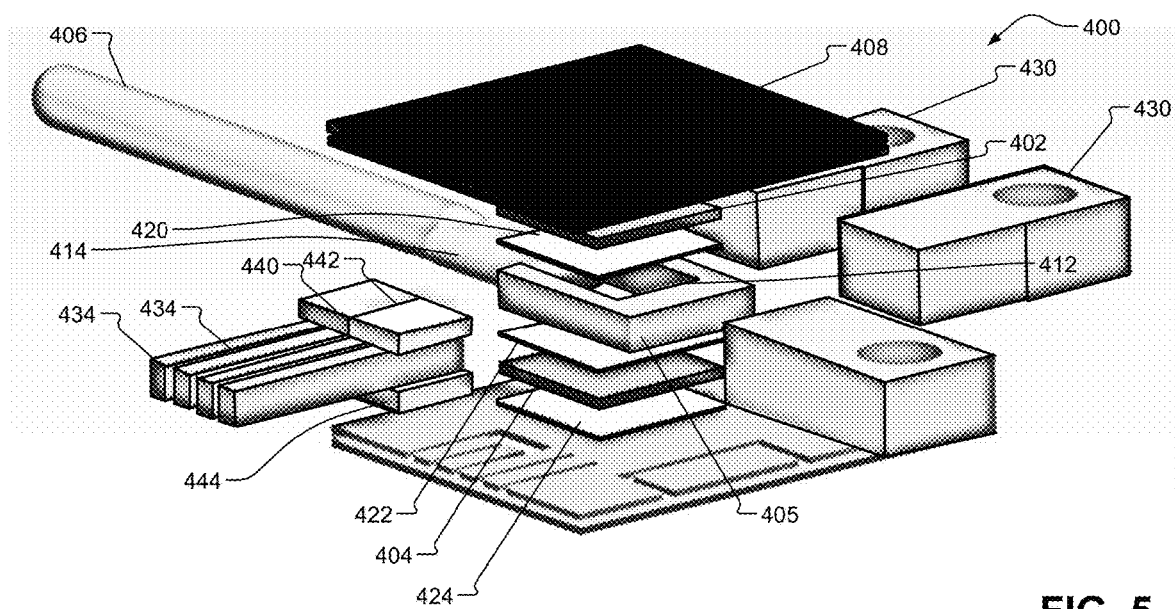
FIG. 5 is an exploded view of the half-bridge power module of FIG. 4.

FIGS. 4-5 show a half-bridge power module 400 including stacked dies 402, 404, a center spacer layer 405, a heat pipe 406, and DBC stacks 408, 410. The half-bridge power module 400 may further include a cold plate, an example of which is shown in FIG. 6. The center spacer layer 405 is disposed between the dies 402, 404. The heat pipe 406 extends at least partially into the center spacer layer 405 between the dies 402, 404. The dies 402, 404, the center spacer layer 405 and a portion of the heat pipe 406 are disposed between the DBC stacks 408, 410. The DBC stacks 408, 410 are disposed between portions of the cold plate. Thermal energy passes (i) from first sides of the dies 402, 404 to the center spacer layer 405 and to the heat pipe 406, and (ii) from second sides of the dies 402, 404 opposite the first sides of the dies 402, 404 to the DBC stacks 408, 410, which pass the thermal energy to the cold plate.

The center spacer layer 405 may directly contact the dies 402, 404 or as shown may be in contact with first attachment layers 420, 422, which separate the dies 402, 404 from the center spacer layer 405. The dies 402, 404 may be separated from the DBC stacks 408, 410 by second attachment layers (attachment layer 424 is shown in FIG. 3 between the die 404 and the DBC stacks 410). The center spacer layer 405 may be 'C'-shaped or cup-shaped and include an open end 412 to receive a portion 414 of the heat pipe 406. The heat pipe 406 may be generally cylindrical shaped except in the portion 414, which may be: flattened to be compatible with power module packaging; disposed between the dies 402, 404; and provide improved thermal energy transfer from the dies 402, 404 to the heat pipe 106.

The power module 400 is similar to the power module 100 of FIGS. 1-3, except that it includes separated DC terminals 430. The power module 400 may further include an AC terminal 432, and other terminals 434. The other terminals may include gate pins of the switches of the dies 402, 404, temperature sensing pins for detecting temperatures within the power module 400, drain (or return), etc. Attachment layers 440, 442, 444 may be disposed between ends of the terminals 434 and the DBC stacks 408, 410.

The power modules of FIGS. 1-5 include 3-D structures with current paths in X, Y and Z directions, as opposed to in only X and Y directions. The 3-D structures allow for more current flow in the Z-direction for a given small area of each power module.

FIG. 6 shows a half-bridge power module 600 including stacked dies 602, 604, a center spacer layer 605, a heat pipe 606, DBC stacks 608, 610 and a cold plate 611. The half-bridge power module 600 may replace and/or be representative of the power modules of FIGS. 1-5. The center spacer layer 605 is disposed between the dies 602, 604. The heat pipe 606 extends into the center spacer layer 605 between the dies 602, 604. The dies 602, 604, the center spacer layer 605 and a portion of the heat pipe 606 are disposed between the DBC stacks 608, 610. The DBC stacks 608, 610 are disposed between portions of the cold plate 611. Thermal energy passes (i) from first sides of the dies 602, 604 to the center spacer layer 605 and to the heat pipe 606, and (ii) from second sides of the dies 602, 604 opposite the first sides of the dies 602, 604 to the DBC stacks 608, 610, which passes the thermal energy to the cold plate 611. The cold plate 611 may include one or more coolant channels (one example coolant channel 613 is shown) through which a coolant flows. The dies 602, 604, the heat pipe 606, and the DBC stacks 608, 610 are stacked and arranged to provide double sided cooling for each of the dies 602, 604.

The center spacer layer 605 may directly contact the dies 602, 604 or as shown may be in contact with first attachment layers 620, 622, which separate the dies 602, 604 from the center spacer layer 605. The center spacer layer 605 is a conductive layer and connects one or more components of the first die 602 to one or more components of the second die 604. The dies 602, 604 may be separated from the DBC stacks 608, 610 by second attachment layers 624, 626. The attachment layers 620, 622, 624, 626 may include a thermal paste material, nano-silver, solder, or other suitable attachment material.

The center spacer layer 605 may be 'C'-shaped, cup-shaped, and/or surround a portion 614 of the heat pipe 606. The center spacer layer 605 may include an open end 612 to receive the portion 614 of the heat pipe 606. The heat pipe 606 may be generally cylindrical shaped except in the portion 614, which may be: flattened to be compatible with power module packaging; disposed between the dies 602, 604; and provide improved thermal energy transfer from the dies 602, 604 to the heat pipe 606. The center spacer layer 605 may be formed of a conductive material, such as copper (Cu), aluminum (Al), or an alloy.

Figure 8:
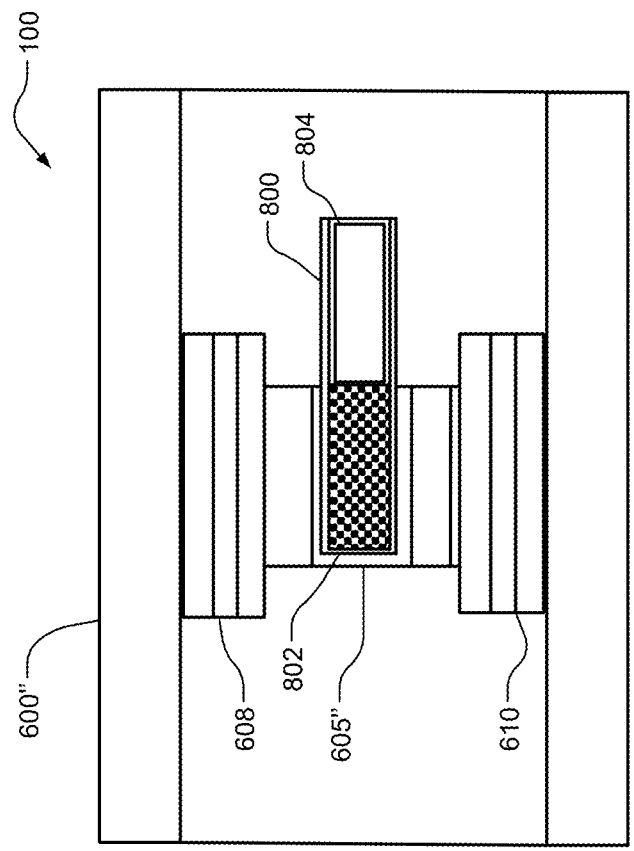
FIG. 8 is a front cross-sectional view of a second example of the half-bridge power module of FIG. 6 viewed along section line A-A and illustrating a heat pipe including a vapor structure outside of a center spacer layer in accordance with another embodiment of the present disclosure.
Figure 7:
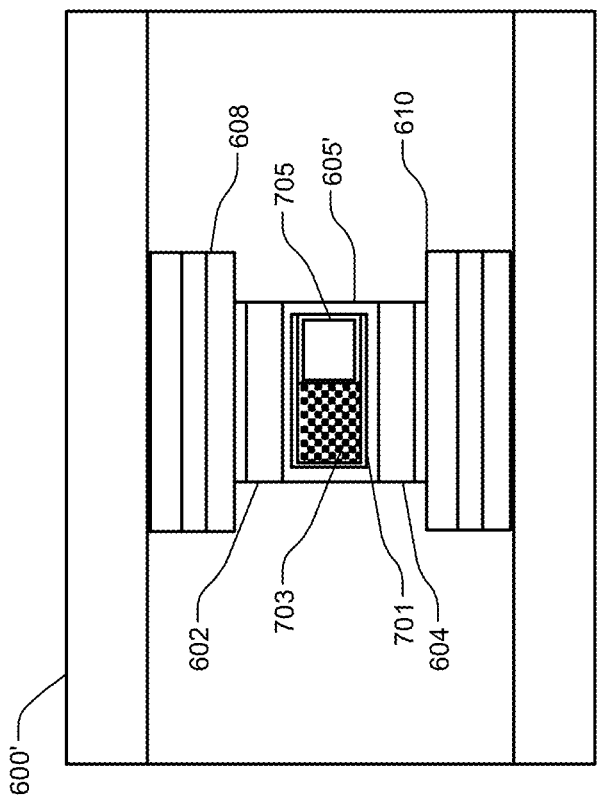
FIG. 7 is a front cross-sectional view of a first example of the half-bridge power module of FIG. 6 viewed along section line A-A and illustrating a heat pipe including a vapor structure disposed within a center spacer layer in accordance with an embodiment of the present disclosure.

The heat pipe 606 may be formed and/or include a metallic material, such as Cu. An electrical insulation material layer 630 may be disposed between the center spacer layer 605 and the heat pipe 606. For example, the heat pipe 606 may be coated with an electrical insulator material, which may be ceramic, such as SiN, $Al_2O_3$ and/or AlN. The coating may include a polymer with ceramic doping. The heat pipe 606 is a sealed vessel that includes a fluid, which is heated, vaporized, cooled back to a fluid, and then reheated. This cycle is iteratively repeated within the heat pipe 606. The heat pipe 606 performs as a thermal terminal to the power module 600. Cross-sectional examples of the heat pipe 606 are shown in FIGS. 7 and 8. The heat pipe 606 includes the flattened portion 614 that is within the center spacer layer 605 and a non-flattened portion 634 that is within the cold plate 611. The flattened portion 614 is shaped for thermal contact with components of the power circuit provided by the dies 602, 604. A thickness T1 of the flattened portion 614 is smaller than a thickness T2 of the non-flattened portion 634.

The DBC stacks 608, 610 may be referred to as substrates and include corresponding conductive layers 635, 636, 637, 638 and center dielectric layers 639, 641 disposed between pairs of the conductive layers 635, 636, 637, 638. The conductive layers 635, 636, 637, 638 may be formed of and/or include copper (Cu). The dielectric layers 639, 641 may be formed of and/or include ceramic, such as silicon nitride (SiN), aluminum nitride (AlN), and/or aluminum oxide ($Al_2O_3$). The DBC stacks 608, 610 may be implemented as direct bond aluminum (DMA) layers, insulated metal substrate (IMS) layers, or as other layered stacks, each of which including one or more conductive layers.

Figure 9:
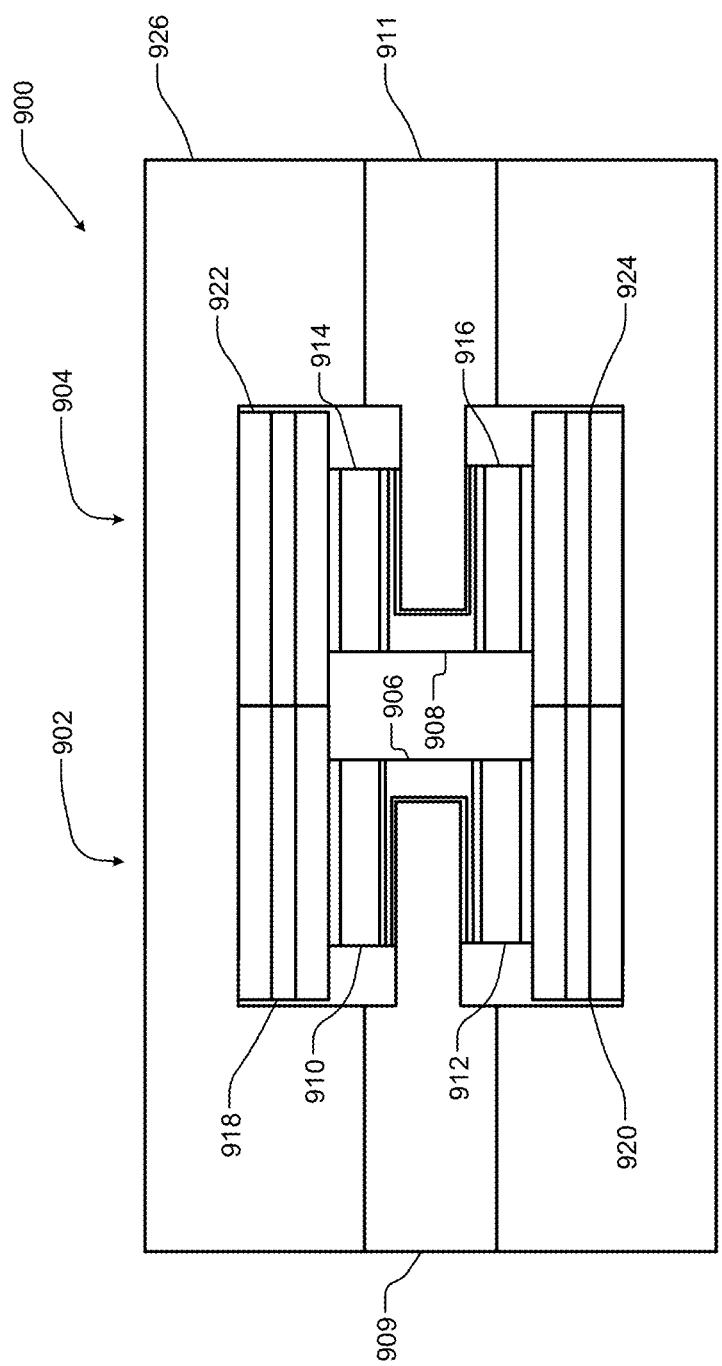
FIG. 9 is a side cross-sectional view of a full bridge power module in accordance with the present disclosure.

The conductive layers 636, 637 provide connections from the circuit components of the circuit components of the dies 602, 604 to other circuit components of other power modules. The layers 636, 637 may extend outward and contact other similar layers of one or more other power modules and/or provide connections to other circuit components of the other power modules and/or a corresponding converter/inverter. An example of this is shown in FIG. 9. The conductive layers 635, 638 may be included to balance the conductive layers 636, 637 and a mechanical coefficient of thermal expansion. The conductive layers 635, 638 do not connect to electrical circuit components. The center dielectric layers 639, 641 isolate the electrical circuit of the power module 600 and associated high voltages.

The cold plate 611 may be 'C'-shaped and formed of and/or include copper (Cu) or aluminum (Al). A cooling circuit 640 is provided to control flow of the coolant through the coolant channel 613 and/or other coolant channels included in the cold plate 611 and/or other cold plates, if included. Although a single cold plate having a single coolant channel is shown, one or more cold plates each of which including one or more coolant channels may be included. One or more cooling channels may be disposed above, below and on sides of the heat pipe 606.

The cooling circuit 640 may include a pump 642, a control module 644 and a reservoir 646. The pump 642 is controlled by the control module 644, which may operate based on detected temperatures of the power module 600 detected via sensors 648. Although shown separate, the sensors may be (i) disposed in and/or be attached to the cold plate 611, and/or (ii) attached and/or disposed elsewhere in the power module 600. The pump 642 circulates coolant through the one or more coolant channels to and from the reservoir 646. The control module 644 may adjust flow of the coolant based on a predetermined set operating temperature.

In one embodiment, a coolant channel is provided above the first DBC stack 608 and another coolant channel is provided below the DBC stack 610, where each coolant channel has a respective input and output connected to the pump. The vertical structure of the stacks (i.e. the die stack including the dies 602, 604, and the center spacer layer 605 and the DBC stacks 608, 610) provides significant reduction in parasitics. The heat pipe 606 in the vertical structure along with the DBC stacks and top side and bottom side cold plate cooling provides double sided cooling per die for significant improvement in thermal management.

FIG. 7 shows an example of the half-bridge power module 600' of FIG. 6 for a first embodiment illustrating a heat pipe structure 701 including a wick structure (or chamber) 703 and a vapor structure (or chamber) 705 disposed within a center spacer layer 605'. The half-bridge power module 600' is configured similarly as the power module 600 of FIG. 6 and includes dies 602, 604 and DBC stacks 608, 610. A coolant (e.g., water) within the heat pipe structure 701 is heated and vaporized in the wick structure 703 and transferred to the vapor structure 705, where the coolant is cooled and returned to a liquid state. The cooled coolant is then transferred back to the wick structure 703. The wick structure 703 may include a honeycomb structure, fins, and/or other structural items configured to facilitate capillary action. The vapor structure 705 may include one or more channels and/or chambers for cooling the vaporized coolant.

FIG. 8 shows an example of the half-bridge power module 600" of FIG. 6 for a second embodiment illustrating a heat pipe structure 800 including a wick structure (or chamber) 802 within a center spacer layer 605" and a vapor structure (or chamber) 804 outside of the center spacer layer 605". A coolant (e.g., water) within the heat pipe structure 800 is heated and vaporized in the wick structure 802 and transferred to the vapor structure 804, where the coolant is cooled and returned to a liquid state. The cooled coolant is then transferred back to the wick structure 802. The wick structure 802 may include a honeycomb structure, fins, and/or other structural items configured to perform a capillary action. The vapor structure 804 may include one or more channels and/or chambers for cooling the vaporized coolant.

The stack up structures of FIGS. 7-8 may be optimized for heat transfer. Wick and vapor structures and/or elements thereof can be sized for maximum sized thermal contact interfaces and maximum thermal energy transfer. The amount of heat transfer may be adjusted, for example, by determining the size and location of the vapor structures 703, 804. The vapor structures 703, 804 may be inside, partially inside and/or partially outside an area between the dies 602, 604.

In addition, although a single stack including a half-bridge structure is shown in FIGS. 1-6, multiple stacks may be included to provide a full-bridge structure including two or three half-bridge structures connected in parallel. An example of which is shown in FIG. 9. In another example embodiment, each switch is made up of multiple dies and are arranged in a stacked structure having a repeating pattern. As a result, in this example embodiment, multiple versions of the disclosed dual sided cooling structures are stacked and form a single half bridge, where each dual-sided cooling structure includes two dies that are each cooled on two opposing sides. The resultant stack may include multiple heat pipe structures, one for each adjacent pair of dies in the resultant stack. Each die in the stack may be (i) cooled on two opposing sides by two heat pipes, or (ii) cooled on a first side by a heat pipe and on a second side opposing the first side by a cold plate and/or heat sink.

FIG. 9 shows a full bridge power module 900 is shown and includes two versions of a power module structure similar to that shown in FIG. 6. The full bridge power module 900 includes two half-bridge structures 902, 904 that face each other. The half-bridge structures 902, 904 include center spacer layers 906, 908, heat pipes 909, 911, dies 910, 912, 914, 916, DBC stacks 918, 920, 922, 924, and a shared cold plate 926. Although the power module 900 is shown including two half-bridge structures, the power module 900 may include one or more additional half-bridge structures that may be disposed adjacent to and/or face the two half-bridge structures 902, 904.

Figure 11:
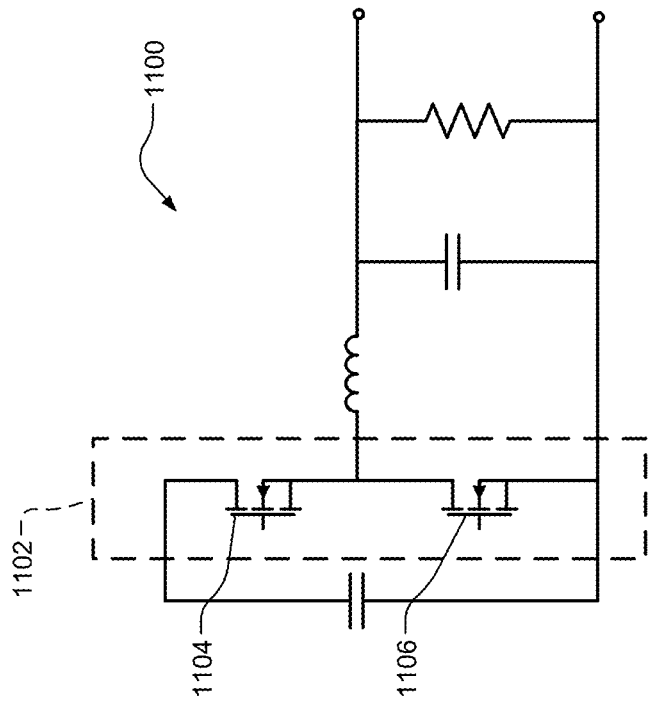
FIG. 11 is a schematic view of a buck converter configured with a power module in accordance with the present disclosure.
Figure 10:
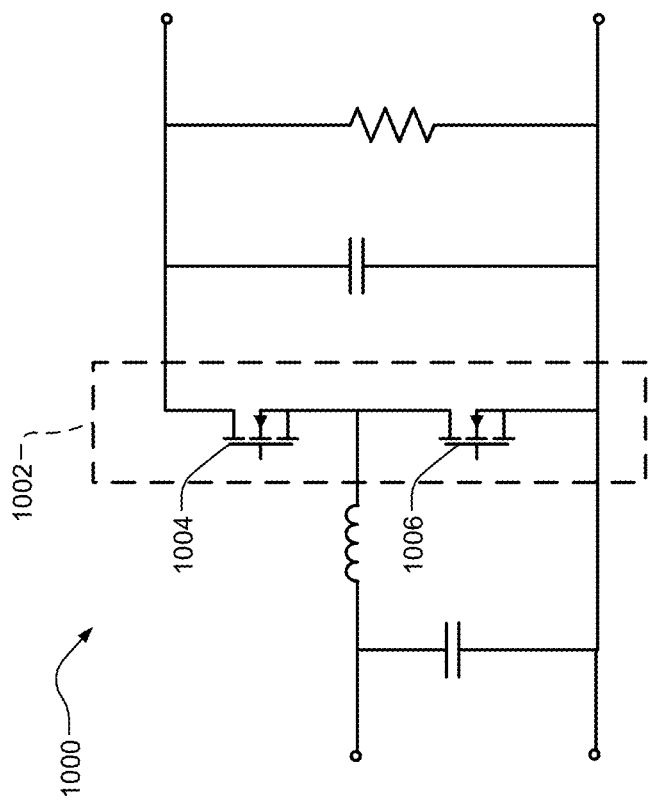
FIG. 10 is a schematic view of a boost converter configured with a power module in accordance with the present disclosure.

FIG. 10 shows a boost converter 1000 configured with a power module 1002, which may be configured as disclosed herein to include stacked dies with double sided cooling per die, where each die includes one of the switches 1004, 1006. FIG. 11 shows a buck converter 1100 configured with a power module 1102, which may be configured as disclosed herein to include stacked dies with double sided cooling per die, where each die includes one of the switches 1104, 1106.

Figure 12:
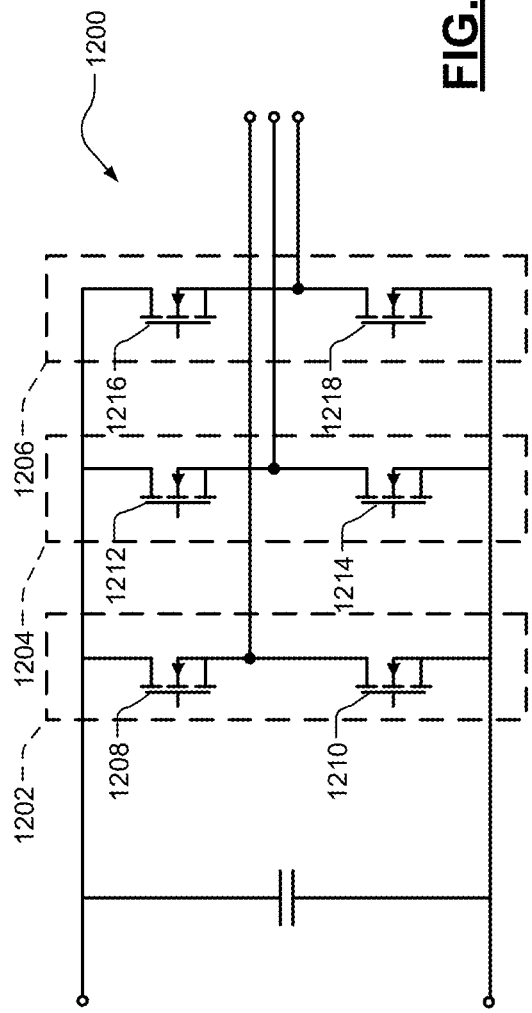
FIG. 12 is a schematic view of a MOSFET voltage source inverter configured with power modules in accordance with the present disclosure.
Figure 13:
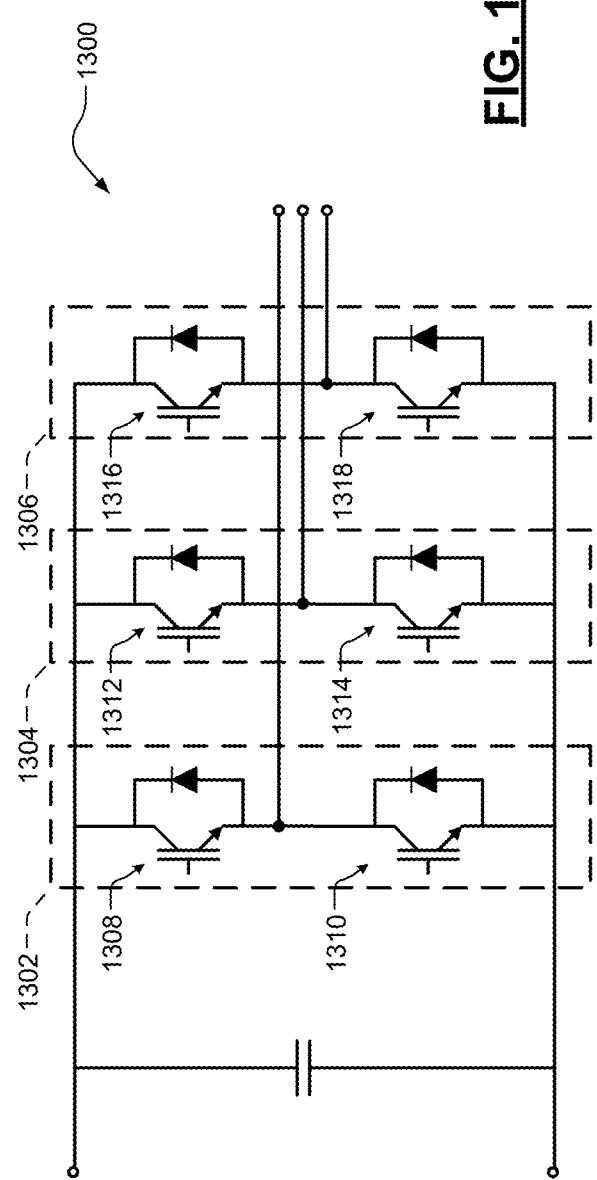
FIG. 13 is a schematic view of a IGBT voltage source inverter configured with power modules in accordance with the present disclosure.
Figure 14:
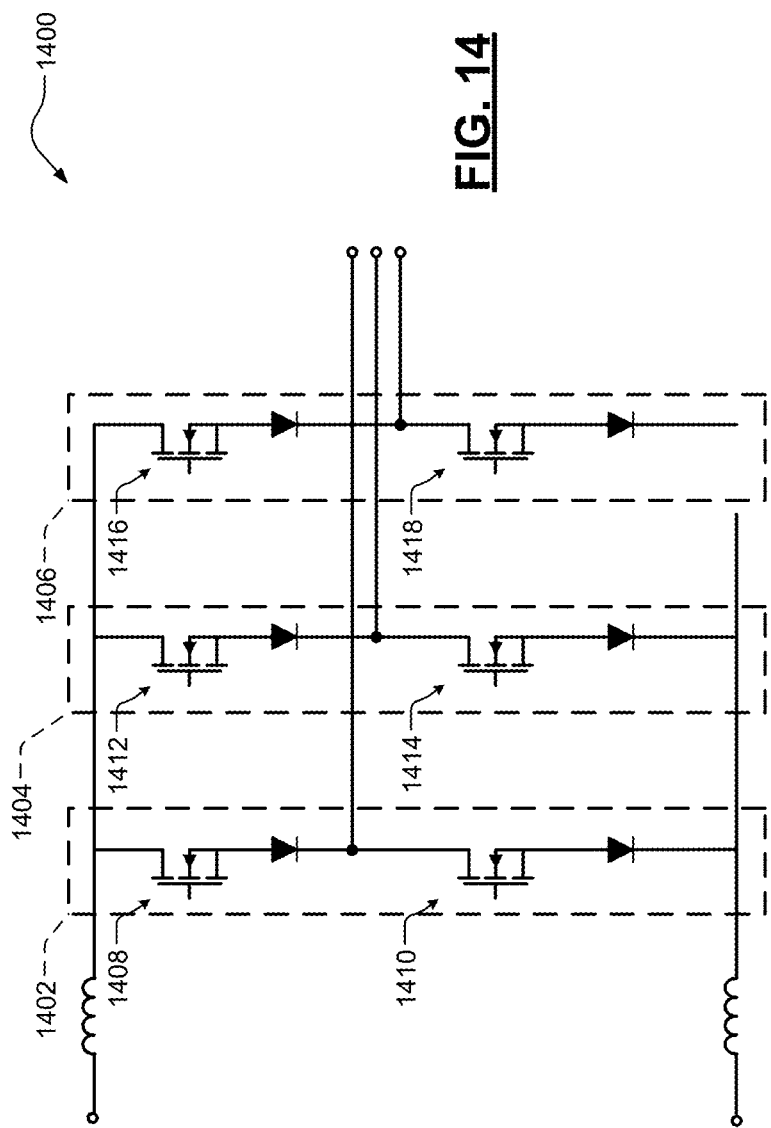
FIG. 14 is a schematic view of a IGBT current source inverter configured with power modules in accordance with the present disclosure.

FIG. 12 shows a MOSFET voltage source inverter 1200 configured with power modules 1202, 1204, 1206, which may be configured as disclosed herein to include stacked dies with double sided cooling per die, where each die includes one of the switches 1208, 1210, 1212, 1214, 1216, 1218. FIG. 13 shows a IGBT voltage source inverter 1300 configured with power modules 1302, 1304, 1306, which may be configured as disclosed herein to include stacked dies with double sided cooling per die, where each die includes one of the switch-diode pairs 1308, 1310, 1312, 1314, 1316, 1318. FIG. 14 shows a IGBT current source inverter 1400 configured with power modules 1402, 1404, 1406, which may be configured as disclosed herein to include stacked dies with double sided cooling per die, where each die includes one of the switch-diode pairs 1408, 1410, 1412, 1414, 1416, 1418.

The vertical stacks of the power modules of FIGS. 10-14 can reduce the sizes of the corresponding planar footprints of the converters and inverters by up to half. Power electronic converters and inverters used for propulsion and for accessories include high side and low side switches, which may be implemented in power modules disclosed herein. The vertical structures allow seamless series connections of switching devices to form converters and inverters.

Figure 15:
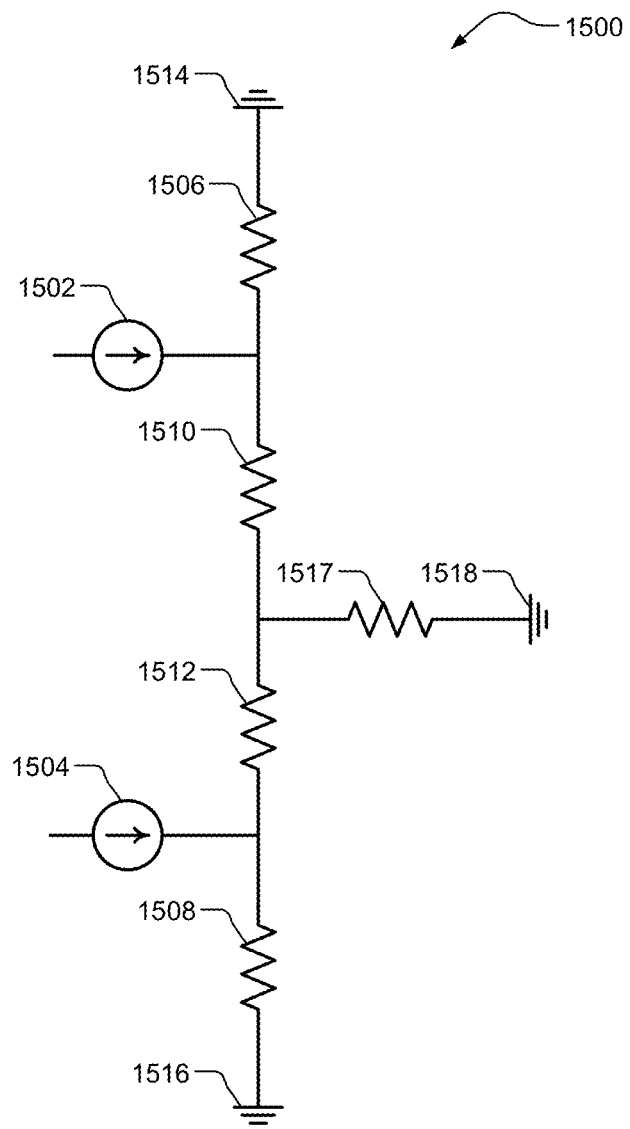
FIG. 15 is a schematic diagram representative of a thermal structure of each of the power modules of FIGS. 1-9.

FIG. 15 shows a thermal structure 1500 representative of each of the power modules of FIGS. 1-9. The thermal structure 1500 includes high side and low side heat flux, represented as current sources 1502, 1504. The thermal structure 1500 further includes coolant and DBC stack resistances 1506, 1508 and heat pipe resistances 1510, 1512 connected in series between portions of a cold plate, represented as ground references 1514, 1516. The high side heat flux (or first current source output) is supplied to a point connected between the resistances 1506, 1510. The low side heat flux (or second current source output) is supplied to a point connected between the resistances 1508, 1512. A heat pipe coolant resistance 1517 is connected at a point between the resistances 1510, 1512 and a ground reference 1518. A ratio of heat transfer between the DBC stacks and the heat pipe of a power module, as disclosed herein, can vary, depending on the sizes, shapes, and materials of the power module. As an example, the DBC stacks may transfer 70% of the total amount of thermal energy that is drawn away from the dies of the power module and the heat pipe may transfer 30% of the total amount of thermal energy drawn away from the dies. The ratio may be adjusted by adjusting the sizes, shapes, and materials of the DBC stacks and the heat pipe, and the arrangement of the heat pipe. The effective thermal conductivity of heat pipes are 10-50 times that of copper alone. Thus, heat pipes provide effective thermal diffusivity and resistance. The number of heat pipes and geometric dimensions of power modules may be set for each particular application to maximize heat transfer and thus maximize cooling of dies.

Figure 16B:
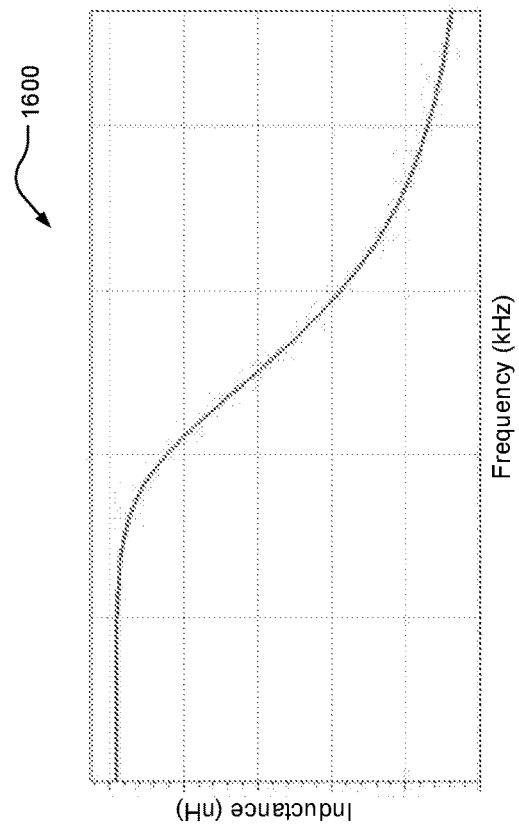
FIG. 16B is an exemplary plot of inductance vs frequency response of the half-bridge power module of FIG. 6.
Figure 16A:
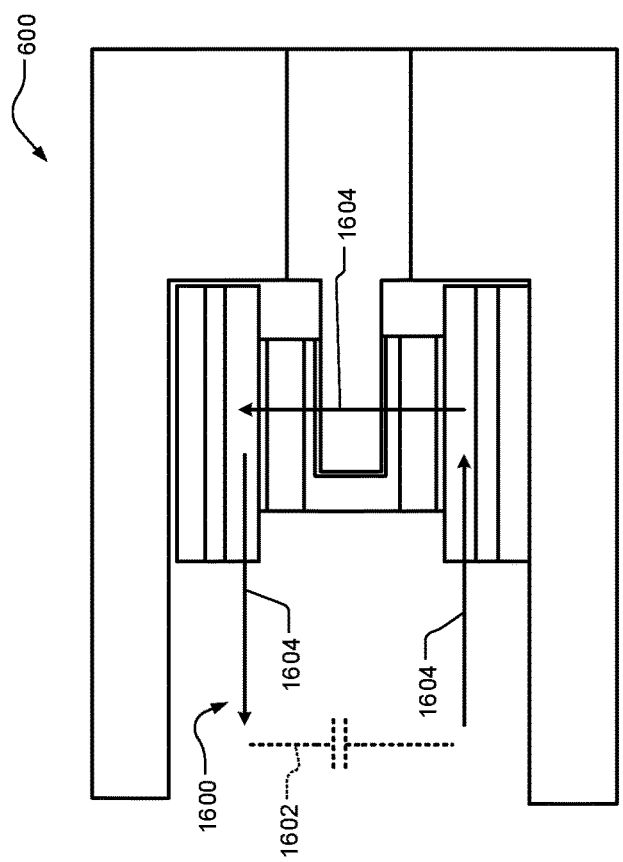
FIG. 16A is a side cross-sectional view of the half-bridge power module of FIG. 6 illustrating a commutation loop representation.

FIG. 16A shows the half-bridge power module 600 of FIG. 6 illustrating a commutation loop representation 1600. The commutation loop shown refers to the serially connected switches (e.g., high side and low side switches in FIGS. 10-14) included in the dies 602, 604 that may be connected in parallel with a capacitor 1602 (e.g., one of the capacitors in FIGS. 10-14). The stacked arrangement of the power module 600 includes parasitic impedance and parasitic resistance. The size of the commutation loop is reduced and the parasitic impedance and the parasitic resistance are minimized due to the compact arrangement of the power module 600. The vertical stack up includes antiparallel current paths, illustrated by arrows 1604, in the commutation loop, which provides low inductance due to field cancellation. The commutation loop inductance is low (e.g., less than 2.5 nano-Henry (nH)). FIG. 16B shows an example plot of inductance vs frequency response of the half-bridge power module of FIG. 6.

Figure 17:
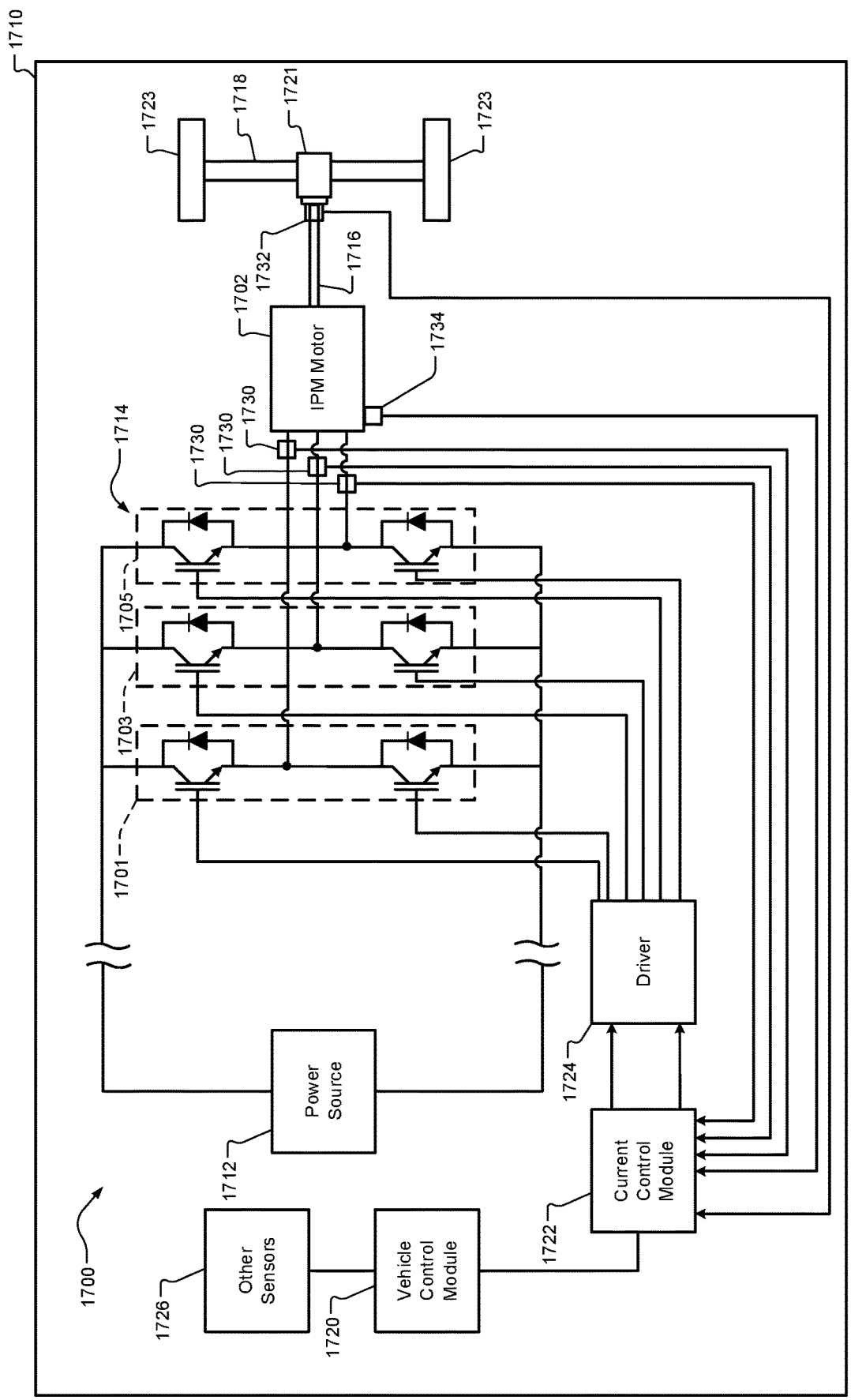
FIG. 17 is an example vehicular system including an inverter configured with power modules including stacked dies with double sided cooling per die in accordance with the present disclosure.

FIG. 17 shows an example vehicular propulsion system 1700 including an inverter configured with power modules 1701, 1703, 1705 as disclosed herein including stacked dies with double sided cooling per die. The propulsion system 1700 may include a motor 1702. Although the motor 1702 is shown as an interior permanent magnet (IPM) motor, the motor 1702 may be a surface permanent magnet motor or other type of electric motor. Although various examples are disclosed herein with respect to a motor, the examples are applicable to other electric machines.

The propulsion system 1700 may be used to drive a vehicle 1710 and further include a power source 1712 (e.g., a battery pack), an inverter 1714, a shaft 1716, an axle 1718 including a differential 1721 and wheels 1723. The inverter 1714 includes the power modules 1701, 1703, 1705 and converts a direct current (DC) voltage to a three-phase alternating current (AC) to power the motor 1702. The motor 1702 drives the shaft 1716, which in turn drives the axle 1718.

The propulsion system 1700 further includes a vehicle control module 1720, a current control module 1722 and a driver 1724. The vehicle control module 1720 may generate a torque request signal. The torque request signal may be generated based on torque commanded, for example, by an accelerator 1726 if included. The current control module 1722 may control the driver 1724 based on the torque request signal. The driver 1724 may, for example, generate pulse width modulation (PWM) signals to control states of transistors of the inverter 1714 based on output of the current control module 1722.

The current control module 1722 controls the driver 1724 based on outputs from sensors. The sensors may include current sensors (e.g., Hall Effect sensors 1730), a resolver 1732, a temperature sensor 1734, and/or other sensors (e.g., an accelerometer). The current sensors may include sensors other than Hall Effect sensors.

The current control module performs a transformation of current phase signals Ia, Ib and Ic for the three phases of the motor to current vector signals Id and Iq. The current control module 1722 determines how much current is flowing and how much current is needed (or requested) and modifies input current levels of the motor 1702 by adjusting output current vector voltage signals supplied to the driver 1724. This is based on (i) the current vector signals Id, Iq, (ii) the position signal out of the resolver 1732, and (iv) the torque request signal from the vehicle control module 1720.

A propulsion system 1700 may include one or more electric motors. Each electric motor may be used to drive one or more axles and/or one or more wheels of the vehicle 1710. As an example, an electric motor may be used to drive an axle of the vehicle 1710 via a differential. The vehicle control module 1720, based on a torque request, may signal the electric motor to rotate an input gear of the differential and as a result, the wheels attached to the axle. The control module 1720 may adjust current, voltage and/or power levels of the electric motor to control acceleration, deceleration and/or speed of the vehicle 1710.

The above-disclosed examples include 3-D power modules with vertical stack ups of semiconductor dies for having compact envelopes and footprints. The layouts of the power modules have small corresponding commutation loop area with low inductance. The layouts include vertically arranged drain-source or emitter-collector connections to reduce power electronics converter and inverter footprints. The power modules include heat pipes for increased heat transfer with vapor channels and/or chambers inside and/or outside regions between dies.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A power module comprising:
a first stack of layers;
a second stack of layers;
a third stack of layers disposed between the first stack of layers and the second stack of layers and comprising a first semiconductor die, a second semiconductor die and a first center spacer layer disposed between the first semiconductor die and the second semiconductor die;
a first heat pipe extending at least partially into the first center spacer layer; and
at least one cold plate or heat sink receiving thermal energy from the first stack of layers and the second stack of layers, wherein the at least one cold plate or heat sink is 'C'-shaped and the first heat pipe extends at least one of into or through the at least one cold plate or heat sink, and
wherein the first stack of layers, the second stack of layers, the third stack of layers, the first heat pipe and the at least one cold plate or heat sink facilitate dual sided cooling of each of the first semiconductor die and the second semiconductor die.

2. The power module of claim 1, wherein:
the first stack of layers comprises a first conductive layer, a second conductive layer, and a first dielectric layer disposed between the first conductive layer and the second conductive layer; and
the second stack of layers comprises a third conductive layer, a fourth conductive layer, and a second dielectric layer disposed between the first conductive layer and the second conductive layer.

3. The power module of claim 1, further comprising a cooling circuit configured to circulate a coolant to and from the at least one cold plate or heat sink.

4. The power module of claim 1, wherein the first heat pipe comprises:
a wick structure disposed between the first semiconductor die and the second semiconductor die; and
a vapor chamber disposed at least partially between the first semiconductor die and the second semiconductor die.

5. The power module of claim 1, wherein the first heat pipe comprises:
a wick structure disposed between the first semiconductor die and the second semiconductor die; and
a vapor chamber that is not disposed between the first semiconductor die and the second semiconductor die.

6. The power module of claim 1, further comprising:
a first attachment layer disposed between the first semiconductor die and the second stack of layers; and
a second attachment layer disposed between the second semiconductor die and the third stack of layers.

7. The power module of claim 6, further comprising:
a third attachment layer disposed between the first semiconductor die and the first center spacer layer; and
a fourth attachment layer disposed between the second semiconductor die and the first center spacer layer.

8. The power module of claim 1, wherein:
the first center spacer layer is a conductive layer that serially connects a first switch of the first semiconductor die to a second switch of the second semiconductor die; and
the first switch and the second switch are arranged to provide a half-bridge structure.

9. The power module of claim 1, further comprising:
a fourth stack of layers;
a fifth stack of layers;
a sixth stack of layers disposed between the fourth stack of layers and the fifth stack of layers and comprising a third semiconductor die, a fourth semiconductor die and a second center spacer layer disposed between the third semiconductor die and the fourth semiconductor die; and
a second heat pipe extending at least partially into the second center spacer layer,
wherein
the at least one cold plate or heat sink receives thermal energy from the fourth stack of layers and the fifth stack of layers, and
the fourth stack of layers, the fifth stack of layers, the second heat pipe and the at least one cold plate or heat sink facilitate dual sided cooling of each of the third semiconductor die and the fourth semiconductor die.

10. The power module of claim 9, wherein the first semiconductor die, the second semiconductor die, the third semiconductor die and the fourth semiconductor die collectively provide a full bridge converter.

11. A power module comprising:
a first stack of layers comprising a first semiconductor die, a second semiconductor die and a first center spacer layer disposed between the first semiconductor die and the second semiconductor die, wherein the first center spacer layer is 'C'-shaped or cup shaped;
a first heat pipe extending at least partially into an open end of the first center spacer layer and receiving thermal energy from the first semiconductor die and the second semiconductor die;
a second stack of layers transferring thermal energy away from the first semiconductor die and comprising a first conductive layer, a second conductive layer, and a first dielectric layer disposed between the first conductive layer and the second conductive layer; and
a third stack of layers transferring thermal energy away from the second semiconductor die and comprising a third conductive layer, a fourth conductive layer, and a second dielectric layer disposed between the third conductive layer and the fourth conductive layer,
wherein
the first stack of layers is disposed between the second stack of layers and the third stack of layers, and
the second stack of layers, the third stack of layers and the first heat pipe facilitate dual sided cooling of each of the first semiconductor die and the second semiconductor die.

12. The power module of claim 11, further comprising:
at least one cold plate or heat sink configured to receive thermal energy from the second stack of layers and the third stack of layers to cool the first semiconductor die and the second semiconductor die; and
a cooling circuit configured to circulate a coolant to and from the at least one cold plate or heat sink.

13. The power module of claim 11, wherein the first heat pipe comprises:
a wick structure disposed between the first semiconductor the and the second semiconductor die; and
a vapor chamber disposed at least partially between the first semiconductor die and the second semiconductor die.

14. The power module of claim 11, wherein the first heat pipe comprises:
a wick structure disposed between the first semiconductor die and the second semiconductor die; and
a vapor chamber that is not disposed between the first semiconductor die and the second semiconductor die.

15. The power module of claim 11, further comprising:
a first attachment layer disposed between the first semiconductor die and the second stack of layers; and
a second attachment layer disposed between the second semiconductor die and the third stack of layers.

16. The power module of claim 15, further comprising:
a third attachment layer disposed between the first semiconductor die and the first center spacer layer; and
a fourth attachment layer disposed between the second semiconductor die and the first center spacer layer.

17. The power module of claim 11, wherein:
the first center spacer layer is a conductive layer that serially connects a first switch of the first semiconductor die to a second switch of the second semiconductor die; and
the first switch and the second switch are arranged to provide a half-bridge structure.

18. The power module of claim 11, further comprising:
a fourth stack of layers comprising a third semiconductor die, a fourth semiconductor die and a second center spacer layer disposed between the third semiconductor die and the fourth semiconductor die;
a second heat pipe extending at least partially into the second center spacer layer and receiving thermal energy from the third semiconductor die and the fourth semiconductor die;
a fifth stack of layers transferring thermal energy away from the third semiconductor die;
a sixth stack of layers transferring thermal energy away from the fourth semiconductor die,
wherein the fourth stack of layers is disposed between the fifth stack of layers and the sixth stack of layers; and
at least one cold plate or heat sink receiving thermal energy from the second stack of layers, the third stack of layers, the fifth stack of layers and the sixth stack of layers,
wherein the first semiconductor die, the second semiconductor die, the third semiconductor die and the fourth semiconductor die collectively provide a full bridge converter.

19. The power module of claim 11, wherein:
the first stack of layers comprises a third semiconductor die, a fourth semiconductor die and a second center spacer layer disposed between the third semiconductor die and the fourth semiconductor die;

a second heat pipe extending at least partially into the second center spacer layer and receiving thermal energy from the third semiconductor die and the fourth semiconductor die;

the second stack of layers transferring thermal energy away from the third semiconductor die;

the third stack of layers transferring thermal energy away from the fourth semiconductor die; and at least one cold plate or heat sink receiving thermal energy from the second stack of layers and the third stack of layers, wherein the first semiconductor die, the second semiconductor die, the third semiconductor die and the fourth semiconductor die collectively provide a full bridge converter.

20. The power module of claim 11, wherein:

the first semiconductor die and the second semiconductor die include respective integrated circuits, each of which having respective electrical components; and the first center spacer layer electrically connects one or more electrical components of the first semiconductor die to one or more electrical components of the second semiconductor die.

* * * * *